United States Patent
Chiang et al.

(10) Patent No.: US 6,248,401 B1
(45) Date of Patent: *Jun. 19, 2001

(54) PROCESS FOR TREATING A METALLIC BODY WITH VAPOR-DEPOSITED TREATMENT LAYER(S) AND ADHESION-PROMOTING LAYER

(76) Inventors: Shiuh-Kao Chiang, 33165 Brackenbury Dr., Solon, OH (US) 44139; Mary K. Prokop, 983 Helmsdale Rd., Cleveland Hts., OH (US) 44112; Tibor Kalnoki-Kis, 2962 Forest Lake Dr., Westlake, OH (US) 44145

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/846,080

(22) Filed: Apr. 25, 1997

Related U.S. Application Data

(62) Division of application No. 08/713,100, filed on Sep. 16, 1996, now Pat. No. 5,709,957, which is a continuation of application No. 08/232,820, filed on Apr. 22, 1994, now abandoned.

(51) Int. Cl.⁷ .................................................. C23C 16/06

(52) U.S. Cl. ................ 427/255.7; 427/250; 427/255.14; 427/255.15; 427/255.6; 427/255.7; 427/99

(58) Field of Search ..................................... 427/250, 255, 427/255.6, 255.7, 96, 98, 99, 255.14, 255.15

(56) References Cited

U.S. PATENT DOCUMENTS

| | | |
|---|---|---|
| 3,220,897 | 11/1965 | Conley et al. . |
| 3,293,109 | 12/1966 | Luce et al. . |
| 3,585,010 | 6/1971 | Luce . |
| 3,690,932 | 9/1972 | Geffcken et al. . |
| 3,998,601 | 12/1976 | Yates et al. . |
| 4,000,349 | * 12/1976 | Dickie et al. ..................... 427/404 |
| 4,082,591 | 4/1978 | Morisaki et al. . |
| 4,105,821 | 8/1978 | Blaich et al. . |
| 4,268,541 | 5/1981 | Ikeda et al. . |

(List continued on next page.)

FOREIGN PATENT DOCUMENTS

| | | |
|---|---|---|
| 0374874 | 12/1989 | (EP) . |
| 0508428 | 10/1992 | (EP) . |
| 0516248 | 12/1992 | (EP) . |
| 0541997 | 5/1993 | (EP) . |
| 57-087324 | 5/1982 | (JP) . |

OTHER PUBLICATIONS

Official Action Issued May. 26, 2000 against European Application 95302699.4–2111/0678596.

Primary Examiner—Shrive Beck
Assistant Examiner—Bret Chen
(74) Attorney, Agent, or Firm—Michael A. Centanni

(57) ABSTRACT

This invention relates to a metal body having at least one vapor-deposited treatment layer overlying and adhered to at least one side of the metal body, and a layer of adhesion-promoting material overlying and adhered to at least one treatment layer, provided that when two treatment layers are deposited on one side of the body and the first layer is vapor-deposited zinc, the second layer is not vapor-deposited silica or alumina, said adhesion-promoting material being suitable for enhancing adhesion between said body and another substrate. The invention also relates to laminates comprising metal foils and at least one vapor-deposited treatment layer overlying and adhered to at least one side of the metal foil; a layer of adhesion-promoting material overlying and adhered to at least one vapor-deposited treatment layer; and a layer of an electrically non-conductive material overlying and adhered to the adhesion-promoting layer.

21 Claims, 1 Drawing Sheet

U.S. PATENT DOCUMENTS

| | | |
|---|---|---|
| 4,277,516 | 7/1981 | Behn et al. . |
| 4,357,395 | 11/1982 | Lifshin et al. . |
| 4,383,003 | 5/1983 | Lifshin et al. . |
| 4,431,710 | 2/1984 | Lifshin et al. . |
| 4,434,022 | 2/1984 | Kamada et al. . |
| 4,452,664 | 6/1984 | Grey, Jr. et al. . |
| 4,455,181 | 6/1984 | Lifshin et al. . |
| 4,526,806 | 7/1985 | Haque et al. . |
| 4,544,571 | 10/1985 | Miller . |
| 4,603,057 * | 7/1986 | Ueno et al. ............ 427/255 |
| 4,751,146 * | 6/1988 | Maeda et al. ............ 428/461 |
| 4,863,762 | 9/1989 | Aramaki et al. . |
| 4,902,556 * | 2/1990 | Benedikt et al. ............ 428/416 |
| 4,923,678 | 5/1990 | Benedikt et al. . |
| 4,923,734 | 5/1990 | Benedikt . |
| 5,039,570 | 8/1991 | Sturm . |
| 5,070,216 | 12/1991 | Thornton . |
| 5,096,546 | 3/1992 | Kitamura et al. . |
| 5,130,192 * | 7/1992 | Takabayashi et al. ............ 427/250 |
| 5,135,629 | 8/1992 | Sawada et al. . |
| 5,246,782 * | 9/1993 | Kennedy et al. ............ 428/421 |
| 5,270,082 * | 12/1993 | Lin et al. ............ 427/255.7 |
| 5,273,775 | 12/1993 | Dyer et al. . |
| 5,318,799 * | 6/1994 | Schulten et al. ............ 427/250 |
| 5,366,814 | 11/1994 | Yamanishi et al. . |
| 5,431,803 * | 7/1995 | DiFranco et al. ............ 428/606 |
| 5,587,341 | 12/1996 | Masayuki et al. ............ 438/109 |
| 5,689,879 * | 11/1997 | Urasaki et al. ............ 427/96 |

* cited by examiner

PROCESS FOR TREATING A METALLIC BODY WITH VAPOR-DEPOSITED TREATMENT LAYER(S) AND ADHESION-PROMOTING LAYER

This is a division of application Ser. No. 08/713,100, filed Sep. 16, 1996 now U.S. Pat. No. 5,709,956 and a con. of Ser. No. 08/232,820 Apr. 22, 1994, now abandoned.

TECHNICAL FIELD

This invention relates to metallic bodies, and more particularly, to metal foils such as copper foils. The metal bodies have at least one vapor-deposited treatment layer overlying at least one side thereof, and a layer of an adhesion-promoting material overlying at least one treatment layer. These foils are useful in the manufacture of a variety of products including batteries, EMI/RFI shielding gaskets and panels, and printed circuit boards (PCBs).

BACKGROUND OF THE INVENTION

The present invention relates to the surface treatment of metal bodies, and more particularly, to metal foils such as copper foils which are used in the production of a variety of products including printed circuit boards. More particularly, the invention relates to surface treatments for improving the properties of metallic bodies such as copper foils to maintain a bright copper tone during long storage and throughout lamination procedures conducted under heat and pressure while at the same time retaining the solderability and/or solder-wettability of the surface of the copper foil.

Printed circuit boards are currently used as the substrate materials in a wide variety of electronic devices. Typically, these boards are fabricated from a thin sheet of copper foil laminated to either a fiberglass/epoxy hard board or, in some instances, flexible plastic substrates. During the latter stages of the fabrication, the copper foil is printed with the necessary circuit pattern, and the unnecessary portions of the copper foil are then etched away to provide the desired interconnecting circuitry between various components in the electronic circuit design.

Copper foils used in such applications are prepared generally either by electrolytic deposition or a rolling technique. When the copper foil is produced electrolytically, the copper foil contains a matte or rough side and a shiny side. The side laminated to the plastic substrates generally is the matte side. Whether electrolytically formed copper foil or rolled copper foil is used, the surface of the foils thus formed are not readily amenable to the production of adequate bond strength after lamination. Therefore, the foil must be treated by additional chemical processes to improve its properties including bondability to resin surfaces, oxidation-resistance, corrosion-resistance, etc. The shiny side of the copper foils are treated to prevent oxidation during storage or lamination under heat and pressure. Various techniques have been suggested and utilized to improve the adhesion of the matte side of the copper foil to various polymeric substrates. One such practice for achieving adhesion between copper foil and insulating polymeric substrates has been to roughen the copper surface.

Surface roughening has been achieved by several means. The electrodeposited copper foils can be electroformed with a rough surface. On top of this rough surface further roughening is carried out by applying a high surface area treatment. These treatments may be a copper deposited electrolytically in nodular or powder form, or a copper oxide which grows nodular or dendritic, among others. Often times the rolled copper foil has mechanical roughness imparted to it during rolling or by subsequent abrasion. The rolled foils also are conventionally treated with surface area increasing nodular copper or copper oxide treatments.

These surface roughening treatments increase adhesion to the polymers by forming a mechanical interlock with the resin. The mechanical interlock is formed when an adhesive in its liquid state is applied and then cured or when the resin melts and flows prior to cure during lamination. The polymers flow around the roughened surface area treatments to form the mechanical interlock.

There are several factors contributing to the adhesion measured between the copper foil and the polymeric resin. Some of these are surface area, type of roughness, wettability, chemical bond formation, type of chemical bond, formation of interpenetrating networks, and properties of the adhering materials.

During an adhesion test the interlocked resin and copper often adhere well enough that failure occurs within the resin, a cohesive failure. With some resins the mechanical interlocking of treatment and resin does not result in the desired high adhesion and failure occurs at the interface between resin and copper, an adhesive failure.

The surface roughening that has been used to enhance adhesion between copper and polymeric resin substrates may cause difficulties in the manufacture of PCBs and contribute to poor PCB performance. In the subtractive copper etching process additional etching time is required to remove the dendrites or nodules embedded in the resin. This not only slows down the production process but contributes to greater line loss due to the lateral etching of the copper line's sidewalls. The surface roughening contributes to poor PCB electrical performance by degrading high frequency electrical signals. The necessity of having a rough base foil has limited other properties, such as tensile strength and elongation, that produce good laminate and PCB performance. The dendritic or nodular surface roughening treatments are difficult to apply, requiring special equipment in the case of electrolytic treatment, and special chemicals in the case of the oxide treatments.

The bonding strength of the foils to the polymeric substrates can also be improved by coating the foils with materials which are capable of enhancing the adhesion between the foil and the polymeric substrates. Various materials have been suggested in the literature as adhesion-promoting compounds, and these include organic materials such as phenol resins, epoxy resins, urethanes, silanes, polyvinyl butyral resins, etc. It also has been suggested to deposit layers of various metals and metal alloys to improve the adhesion between the copper foil and the polymeric substrates.

U.S. Pat. No. 3,585,010 (Luce et al) describes a conductive element for a printed circuit board comprising a copper foil and a metallic barrier layer which substantially reduces the staining of printed circuit boards. The metallic layer is a thin deposit of a metal selected from the group consisting of zinc, indium, nickel, cobalt, tin, brass and bronze. The barrier layer is applied to one side of the copper foil by standard electrodeposition procedures pertaining the particular metallic layer. The patentees also suggest that the metallic barrier layer does not have to be electrodeposited on the surface of the copper foil but may be applied by other means such as vapor deposition. After deposition of the barrier layer, the foil may be given additional treatments prior to lamination such as with a corrosion-inhibiting agent.

U.S. Pat. No. 4,268,541 (Ikeda et al) describes a process for producing a material having a vapor-deposited metal layer useful particularly in forming recording materials. The process described in this patent comprises vapor depositing a layer of metal, a layer of different metals in contact with each other, a layer of a metal alloy, a layer of a metal and a metal compound in contact with each other or a layer of a metal compound as the metallic layer on a support or substrate which may be a polymeric material, a composite of a polymeric material and paper, woven or non-woven cloth or paper. Subsequent to the formation of a layer by vapor deposition, a second layer of an organic material is applied over the metallic layer by vapor deposition using an evaporable organic material. The layer of organic compound over the metal layer serves as a buffering layer for the metallic layer and renders the metallic layer formed by vapor deposition more slippable.

U.S. Pat. No. 4,383,003 (Lifshin et al) and its divisional U.S. Pat. No. 4,455,181 describe copper-clad laminates useful in preparing high resolution printed circuit patterns. Laminates are made by vapor depositing a film of zinc on a vapor-deposited copper film which is on a silica-coated aluminum carrier sheet, vapor depositing a silica film on the resulting zinc-copper foil, bonding the resulting body to a substrate, and then stripping the silica-coated aluminum carrier sheet from the copper clad laminate. One of the laminated products described in the '003 patent comprises a thin copper sheet, an ultra-thin film of zinc vapor-deposited on said copper sheet and a film of silica or alumina vapor-deposited on said zinc film. Optionally, a coating of a silane coupling agent is deposited over the silica film.

SUMMARY OF THE INVENTION

This invention relates to a metal body having at least one vapor-deposited treatment layer overlying and adhered to at least one side of the metal body, and a layer of adhesion-promoting material overlying and adhered to at least one treatment layer, provided that when two treatment layers are deposited on one side of the body and the first layer is vapor-deposited zinc, the second layer is not vapor-deposited silica or alumina, said adhesion-promoting material being suitable for enhancing adhesion between said body and another substrate. The invention also relates to laminates comprising: a metal foil and at least one vapor-deposited treatment layer overlying and adhered to at least one side of the metal foil; a layer of adhesion-promoting material overlying and adhered to the at least one vapor-deposited treatment layer; and a layer of an electrically non-conductive material overlying and adhered to the adhesion-promoting layer.

DESCRIPTION OF THE PREFERRED EMBODIMENTS

Metal Bodies

Figure 1:
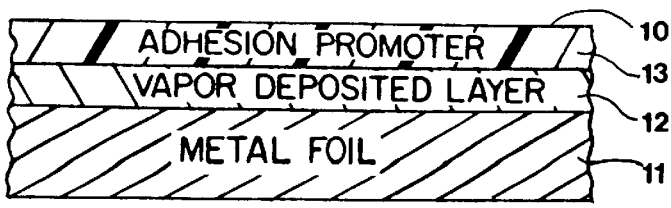
FIG. 1 is a schematic diagram representing a cross-sectional view of a metal foil of the present invention including one vapor-deposited layer and one adhesion-promoter layer.

The metal bodies which can be utilized and treated in accordance with the present invention are preferably electrically conductive metal bodies. The choice of metal body will depend upon the desired end use of the metal body.

The metal bodies utilized in the present invention may be of any configuration such as metal sheets, bars, rods, wires, foils, etc. Preferably, the metal body is a foil, more particularly, a copper or copper-based alloy foil. Accordingly, the discussion within the specification generally will be directed to foils, and more particularly, copper foils, although the general discussion should be understood to be applicable to other foils and metal bodies.

Copper and copper-based alloy foils are well known in the art and are made by various techniques. Wrought or rolled foil is produced by mechanically reducing the thickness of a metal (copper) or alloy (copper alloy) strip or ingot by a process such as rolling. Electrodeposited foil is produced by electrolytically depositing copper ions on a rotating cathode drum and then peeling the deposited strip from the cathode. This procedure can be used to form continuous strips of the foil. Foils can also be prepared by other procedures. For example, a copper foil can be prepared by electrodepositing or vapor depositing a layer of copper on a conductive carrier such as aluminum. Another copper foil can be prepared by rolling a copper layer onto an alloy foil such as an iron-nickel alloy. The copper can be rolled onto one or both sides of the iron-nickel alloy. Yet another example of a multilayer foil is a molybdenum foil or layer coated on both sides with copper. Alternatively, copper can be vapor-deposited on a release coated carrier, and thereafter the vapor-deposited film of copper can be removed from the release-coated carrier.

Electrodeposited and rolled or wrought copper foils are preferred, and electrodeposited copper foils are especially preferred. The copper foils typically have nominal thicknesses ranging from about 0.0002 inch to about 0.02 inch. Foil thickness is sometimes expressed in terms weight and typically the foils of the present invention have weights or thicknesses ranging from about ⅛ to about 14 oz/ft$^2$. The foils used as the base foil in this invention may be as-plated foils or annealed electrodeposited foils. The wrought copper foils may be as-rolled or annealed wrought copper foils.

Electrodeposited copper foils have a smooth or shiny (drum) side and a rough or matte (copper deposit growth front) side. The treatment layers described more fully below can be adhered to either side of the foil and in some instances are adhered to both sides.

In one embodiment, the side or sides of the foil (electrodeposited or wrought) to which the treatment layer is adhered is a "standard-profile surface," "low-profile surface" or "very-low-profile surface." The term "standard-profile surface" is used herein to refer to a foil surface having an $R_{tm}$ of about 10 µm or less. Standard profile electrodeposited copper foil also may be characterized as having a columnar grain structure of preferred orientation and high densities of crystal defects such as discolorations and twin boundaries, and the foil has an average grain size of up to about 20 microns. The term "low-profile surface"

refers to a foil surface having an $R_{tm}$ of about 7 μm or less. The term "very-low-profile surface" refers to a foil surface having an $R_{tm}$ of about 4 μm or less. $R_{tm}$ is the mean of the maximum peak-to-valley vertical measurement from each of five consecutive sampling measurements, and can be measured using a Surftronic 3 profilometer marketed by Rank Taylor Hobson, Ltd., Leicester, England.

When the copper foil products of the present invention are to be used in PCB applications, it is often desirable that the copper foils have controlled low profiles to provide etchability and impedance control. It is also preferred that these foils have high ultimate tensile strengths (UTS) to provide desired handling and surface quality characteristics, and high elongations at elevated temperatures to resist cracking. In one embodiment, the copper foils utilized in the present invention are characterized as being controlled low profile electrodeposited copper foils having a substantially uniform randomly oriented grain structure that is essentially columnar grain-free and twin-boundary-free and has an average grain size of up to about 10 microns. These foils generally have ultimate tensile strength measured at 23° C. in the range of about 70,000 to about 120,000 psi and an elongation measured at 180° C. of about 6% to about 28%. Copper foils having these characteristics may be prepared by the process which comprises (A) flowing an electrolyte solution between an anode and a cathode and applying an effective amount of voltage across said anode and said cathode to deposit copper on said cathode; said electrolyte solution comprising copper ions, sulfate ions, and at least one organic additive or derivative thereof, and the current density being in the range of about 0.1 to about 5 A/cm$^2$; and (B) removing the copper foil from said cathode. In one embodiment, the chloride ion concentration of said solution is up to about 1 ppm.

Such copper foils generally have a matte-side raw foil roughness ($R_{tm}$) of 1 to about 10 microns. The $R_{tm}$ for the shiny side of these foils is preferably less than about 6 microns, and more often in the range of from about 2 to about 5 microns. The weights for these copper foils generally are in the range of from about 1/8 to about 14 ounces per square foot. The foil having a weight of 0.5 ounce per square foot has a nominal thickness of about 17 microns.

The terms "untreated" and "raw" are used herein to refer to a base foil as prepared which has not been subjected to subsequent treatment, (e.g., one or more surface roughening treatments) for the purpose of refining or enhancing the foil properties. The raw foil is also referred to as "as plated" or "as rolled." The term "treated" as used herein is used herein to refer to raw or base foil that has been subjected to at least one such treatment. These treatments are conventional and typically involve the use of various treating and rinsing solutions. Either or both sides of the foil can be treated. The treatments may be chemical or physical treatments.

Various chemicals can be applied to the raw foil to improve the characteristics of the foil surface. For example, the foil surfaces can be contacted with an acid such as sulfuric acid to effect microetching of the surface. Also prior to application of the vapor-deposited treatment layers in accordance with the present invention, the copper foils may be electrolytically provided with various metal coatings such as zinc, tin, copper, chromium or alloys thereof (e.g., chromium-zinc) by dipping and electroplating techniques well known to those skilled in the art. For example, the electroplating of tin or a tin-zinc alloy on the shiny side of a copper foil is described in U.S. Pat. No. 4,082,591 which is hereby incorporated by reference. In another example, the raw foil is dipped in an acid solution of chromic acid (CrO$_3$) to deposit a chromium coating.

Although the foils can be subjected to a surface roughening treatment prior to the application of at least one vapor-deposited treatment layer, it is a significant advantage of the invention that improved adhesive characteristics for the foil can be achieved without subjecting the foil to an added surface roughening treatment. Thus, in one embodiment of the invention, the foil used in the invention can be raw foil which has been cleaned of surface impurities but is otherwise characterized by the absence of any added surface roughening treatment on the side or sides to which the vapor-deposited treatment layer(s) is adhered. The term "added surface roughening treatment" refers to any treatment performed on a base or raw foil that increases the roughness of the surface of the foil. These treatments include chemical treatments such as copper deposited electrolytically in nodular or powder form, or copper oxide which grows nodular or dendritic. In one preferred embodiment, the base foil is microetched by dipping in an acid solution such as a 20% by volume of sulfuric acid in water at about 65° C. for about 15 seconds followed by an immediate water rinse. Other useful surface modification treatments include glow discharge and sputtering.

In one embodiment, the mechanical roughness imparted to wrought copper foil during rolling or by subsequent abrasion which increases roughness beyond that of a standard profile surface is considered to be an added surface roughening treatment. In another embodiment, any roughness imparted to the raw or base copper foil that increases the roughness of said foil beyond that of a standard profile surface is considered to be an added surface roughening treatment. In another embodiment, any roughness imparted to the raw or base copper foil that increases the roughness of said foil beyond that of a low-profile surface is considered an added surface roughening treatment. In another embodiment, any roughness imparted to the raw or base copper foil that increases the roughness of said foil beyond that of a very low-profile surface is considered an added surface roughening treatment.

As indicated above, it is within the scope of the invention to apply the vapor-deposited treatment layer(s) to foils which have been subjected to an added surface roughening treatment the treatment. Thus, in one embodiment, one or both sides of the foil may be treated to provide a roughened layer of copper or copper oxide prior to vapor deposition of the treatment layer or layers. The copper can be deposited electrolytically in nodular or powder form by techniques well known to those skilled in this art. The copper oxide can grow nodular or dendritic. In another embodiment, the side or sides of the base or raw foil to which the vapor-deposited treatment layer is adhered is untreated prior to the application of the vapor-deposited treatment layer to the foil.

Treatment Layer(s)

The metal bodies of the present invention have at least one vapor-deposited treatment layer overlying and adhered to at least one side of the metal body. As noted above, the vapor-deposited treatment layer may be deposited over raw or untreated foil, or the treatment layers may be applied to the foil after the foil has been subjected to one or more added surface roughening treatments.

In one embodiment, one side of the foil has a treatment layer, and in another embodiment, both sides of the foil have a treatment layer. In a further embodiment of the invention, one or both sides of the foil may have two or more consecutive vapor-deposited treatment layers as described more fully below. In yet another embodiment, the foils of the present invention have at least one roughened layer of copper or copper oxide between the raw or base foil and the vapor-deposited treatment layer or layers. In a further embodiment, the foils of the present invention may have at least one chemically or electrodeposited metal or metal oxide layer on the foil and between the foil and the one or more vapor-deposited layers.

A variety of vapor-deposited treatment layers may be present on the foils of the present invention to provide desirable and beneficial properties to the foils such as stabilization layers, barrier layers, or combinations thereof to prevent or minimize the appearance of stains and spottings throughout the resinous layer when the foils are used to form printed circuitboards, oxidation-inhibiting layers, moisture-resistant layers, etc.

In one preferred embodiment, the vapor-deposited treatment layer or layers deposited on one or both sides of the foil is a metallic barrier layer and/or a metallic stabilization layer. As noted, the invention contemplates the use of more than one such metallic layers on either or both sides of the foil. The term "metallic" as applied to the metallic layers useful in the present invention includes metals, alloys, as well as metal compounds such as metal oxides or nitrides although metals are preferred.

Examples of metals which may be included in the vapor-deposited metallic layer include magnesium, aluminum, titanium, chromium, manganese, copper, bismuth, cobalt, nickel, zinc, indium, tin, molybdenum, silver, gold, tungsten, zirconium, antimony, chromium-zinc alloy, brass, bronze, and mixtures of two or more of said metals. When the metallic layers or layers are deposited on the matte side of an electrodeposited copper foil, the metal is preferably indium, tin, cobalt, nickel, zinc, copper, manganese, chromium, titanium, bismuth, bronze or zinc-chromium alloy. Preferred metals for the metal layer or layers applied to the shiny side of an electrodeposited copper foil are those which are etchable and these include indium, chromium, magnesium, aluminum, copper, tin, nickel, cobalt, zinc or zinc-chromium alloys.

The foils of the present invention also can contain two or more vapor-deposited layers on one or both sides of the foil. For example, a first (a barrier layer) layer of any of the above-identified metals or metal alloys can be vapor-deposited on the copper foil followed by the vapor deposition of a second layer (stabilization layer). Alternatively, the second layer may, for example, comprise a metal oxide such as silica, alumina, indium oxide, magnesium oxide, etc., provided that the second vapor-deposited layer does not contain vapor-deposited silica or alumina when the first vapor-deposited layer is zinc.

The thickness of the one or more treatment layers on the metal bodies of the present invention can be varied, and the desired thickness for any particular application can be readily determined by one skilled in the art. In general, when a treatment layer is a metallic layer, the thickness of the metallic layer may range from about 10 to about 10,000 Å, and in some instances, will be within the range of from about 20 to 1000 Å.

In another embodiment wherein a barrier layer of metal overlies and is adhered to the base foil, and a metal stabilization layer is vapor-deposited over the barrier layer, the thickness of the barrier layer may range from about 0.01 to about 1 micron, and the thickness of the stabilization layer may vary from 0.002 to about 0.1 micron. Metals which are particularly useful in the stabilizer layer include tin, nickel, molybdenum, indium, magnesium, aluminum, Zn, Cr and Zn—Cr alloys.

The vapor-deposited treatment layers can be obtained by vapor deposition techniques well known to those skilled in the art, and such techniques include physical vapor deposition (PVD) which includes thermal evaporation, electron beam deposition, inductive and/or resistive deposition, ion plating, sputtering, plasma-activated evaporation, reactive evaporation, and activated reactive evaporation; and chemical vapor deposition (CVD). Physical vapor deposition also has been referred to in the literature as vacuum metallization and evaporative coating. In thermal evaporation deposition procedures, the material to be applied to the metallic body (generally a metal or alloy) is heated in a high vacuum (e.g., $10^{-2}$ to about $10^{-6}$ torr) whereupon the material evaporates or sublimates and travels to the metal object to be coated. In sputtering processes, energetic inert ions created in a plasma discharge impact a target and cause the ejection of coating material through momentum exchange. Physical vapor deposition essentially involves the transfer of the material and the formation of coatings by physical means alone in contrast to chemical vapor deposition in which the material transfer is effected by chemical reactions induced by temperature or concentration gradients between the substrate and the surrounding gaseous atmosphere. The principals of vapor deposition and procedures useful in vapor depositing various materials including metals is described in *Vapor Deposition*, edited by C. F. Powell et al, John Wiley & Sons, Inc., New York, 1966.

Chemical vapor deposition usually is accomplished by vaporizing a metallic halide and decomposing or reacting the vapors at the foil surface to yield the non-volatile metal on the surface of the foil as a coating. The chemical reactions of vapor deposition can be effected by thermal deposition or pyrolysis, hydrogen reduction, reduction with metal vapors, reaction with the metal foil, chemical transport reactions, etc. These procedures are described in detail in Chapter 9 of *Vapor Deposition*, C. F. Powell, J. H. Oxley, and J. M. Blocker, Jr., editors, J. Wiley & Sons, Inc., New York, 1966, and this chapter is incorporated by reference for its description of the CVD processes.

Copper foils having vapor-deposited treatment layers in accordance with this invention, and in particular, vapor-deposited metallic layers, can be obtained utilizing an apparatus available from Edwards Coating Systems, identified as E306A. This unit has an operating vacuum range of from $2 \times 10^{-6}$ mbar to $2 \times 10^{-5}$ mbar. Vapor deposition of metals can generally be accomplished in satisfactory thicknesses (e.g., about 10 Å to 3000 Å) in from about 0.3 to about 40 minutes or more at evaporating currents of from 35 to 80 milliamps. The evaporating current used depends on the amount and form of the material to be vaporized. For example, currents of about 65–80 milliamps generally are used to vapor-deposit indium, tin, chromium, cobalt and nickel. Evaporation currents in the range of 35–50 milliamps are satisfactory for magnesium and zinc, and currents in the range of 50–65 are satisfactory for depositions aluminum, manganese, tin and brass. In the Edwards apparatus the distance from the boat containing the metal to be vaporized to the foil sample is about 5 inches. In general, thin foil or chips of the coating material are placed in a tungsten boat and heated under vacuum.

After the treatment layer has been vapor-deposited on the copper foil, it may be further treated to improve its properties prior to application of the adhesion-promoting layer. The vapor-deposited metallic layer can be heated to an elevated temperature such as from about 80° C. to about 800° C. (depending on the vapor-deposited metal) for a few seconds to one hour to modify the surface coverage, characteristics and properties of the metallic layer. For example, a metallic layer such as indium deposited on a copper foil which does not completely cover the copper foil leaving about 2% to 3% or even 5% exposed copper. When the vapor-deposited indium coating is baked in an oven at an elevated temperature of about 190° C. for 60 minutes, the exposed copper concentration of the surface decreases to as little as 0.5%. In another embodiment, the vapor-deposited metal is baked in an oven in an atmosphere of oxygen to convert at least some of the surface metal to the oxide form. Exposure of the metal surface to nitrogen at an elevated temperature converts at least a portion of the surface metal to metal nitride. Heating of the vapor-deposited metal prior to application of the adhesion-promoting layer also accelerates the formation of an alloy of the base metal and the vapor-deposited metal at the base metal-deposited metal interface.

The properties of the vapor-deposited metallic layer or layers present in the metal foils of the present invention may be further modified by ion-bombardment/heating, oxygen plasma ion bombardment, and electroplating of the vapor-deposited metallic layer with materials which improve desirable properties such as providing oxidation and stabilization protection. For example, the vapor-deposited metal layer may be electrochemically treated with acidic solutions containing, for example, chromium, copper, tin, bismuth, or zinc-chromium mixtures, etc., to deposit chromium, tin, bismuth or zinc-chromium coatings over the vapor-deposited metal coating to improve properties such as oxidation resistance, etc., prior to application of the adhesion-promoting layer.

Adhesion-Promoting Layer

At least one surface or side of the metal bodies of the present invention have at least one vapor-deposited treatment layer as described above, and at least one of the treatment layers has an adhesion-promoting layer overlying and adhered to the treatment layer. The adhesion-promoting layer is adapted for enhancing the adhesion between the foil and a substrate such as a polymeric resin substrate used in the formation of PCBs. Depending on the nature of the adhesive or adhesion-promoter and the intended use of the adhesive layer coated foil, the thickness of this layer may vary over a wide range from about 4 to about 500,000 Å. A wide variety of adhesion-promoting materials are known in the art for improving the adhesion of treated and untreated metal foils to other substrates including polymeric resin substrates, and such conventional adhesives can be utilized in the present invention. Improved adhesion is obtained as a result of the coaction between the adhesive and the vapor-deposited treatment surface or surfaces which have been previously applied to the metal foil. For electrical purposes, high dielectric strength adhesives are selected. The adhesives or adhesion-promoters may be organic, organometallic or inorganic compounds.

In one embodiment, the adhesion-promoting material is an organic material which may comprise thermosetting or thermoplastic polymers and copolymers, and mixtures thereof. When organic materials such as thermosetting or thermoplastic polymers and copolymers are used, they are often referred to in the art as adhesives, and the thickness of the layer is at the higher end of the range given above. Generally, thicknesses of from about 10,000 Å up to about 500,000 Å are applied over the vapor-deposited treatment layer. In contrast, the organometallic compounds useful in the adhesion-promoting layer such as the silane coupling agents are generally referred to as adhesion promoters, and the thickness of the adhesion promoter is much less, e.g., from about 4 Å to about 200 Å.

Examples of thermosetting and thermoplastic polymers and copolymers include epoxy resins, formaldehyde resins, phenol formaldehyde resins, polyester resins, butadiene and acrylonitrile rubbers, polyvinylbutyral resins, etc. Mixed poly(vinylbutyral)-phenol-formaldehyde resins also are useful. Various alkyd resins which are polyesters may be used as adhesive. An example of a useful alkyd resin is a maleic anhydride-ethylene glycol polyester. Such polyesters may be dissolved in styrene and copolymerized in place under heat with the addition of a small amount of a peroxide initiator to provide excellent adhesives.

In one embodiment, the adhesive material used to form the adhesion-promoting layer comprises (A) at least one multi-functional epoxy resin. In another embodiment the adhesion-promoting layer comprises a mixture of epoxy resins comprising (A) at least one multifunctional epoxy resin; and (B) a composition derived from (B-1) at least one difunctional epoxy resin; and (B-2) at least one component represented by the formula:

$$R\text{-}(G)_n \tag{I}$$

wherein in Formula I, R is an aromatic, alicyclic or heterocyclic group; G is a functional group selected from the group consisting of COOH, OHSHNH$_2$NHR$^1$, (NHC(=NH))$_m$NH$_2$, R$^2$COOH, R$^2$OH, R$^2$SH, R$^2$NH$_2$ and R$^2$NHR$^1$, wherein R$^1$ is a hydrocarbon, R$^2$ is an alkylene or alkylidene group, and m is a number in the range of from 1 to about 4; and n is a number ranging from 3 up to the number of displaceable hydrogens on R.

The multifunctional epoxy compounds (A) which can be used alone or in combination with (B) are those containing an average of more than two epoxy groups (oxirane rings) per molecule. In one embodiment these epoxies contain an average of up to about six epoxy groups per molecule. In one embodiment the multifunctional epoxy is an epoxy novolac resin. The multifunctional epoxy can be a trifunctional or tetrafunctional epoxy resin. (A trifunctional epoxy resin is an epoxy resin that contains an average of three epoxy groups per molecule, and a tetrafunctional epoxy resin contains an average of four epoxy groups per molecule.) The multifunctional epoxies typically have average epoxy equivalent weights in the range of about 100 to about 250, and in one embodiment from about 190 to about 240. (An epoxy equivalent weight is the molecular weight of the epoxy molecule divided by the number of epoxy groups in the molecule. Thus, for example, a trifunctional epoxy having a molecular weight of 600 would have an epoxy equivalent weight of 200.)

Examples of commercially available trifunctional epoxy resins that are useful include Tactix 742 (Dow Chemical) and PT 810 (Ciba Geigy). Examples of commercially available tetrafunctional epoxy resins that are useful include MT 0163 (Ciba Geigy), Epon 1031 (Shell) and Epon HPT 1071 (Shell).

The epoxy novolacs that are useful include the epoxy cresols and the epoxy phenol novolacs, Examples of commercially available novolacs that are useful include DEN 438, DEN 439 and Tactix 785 (each of which is available from Dow), DPS 164 (Shell) and ECN 1299 (Ciba Geigy).

The difunctional epoxy resin (B-1) can be any difunctional epoxy resin having an average molecular weight in the range of about 1000 to about 10,000 (epoxy equivalent weight of about 500 to about 5000), and in one embodiment an average molecular weight of about 1000 to about 6000. (A difunctional epoxy resin is an epoxy resin that contains an average of two epoxy groups per molecule.) In one embodiment, a mixture of difunctional epoxy resins is used, one having an average molecular weight of about 1000 to about 3000, preferably about 1500 to about 2500; and the other having an average molecular weight in excess of about 3000 up to about 6000, preferably about 3500 to about 5000.

In one embodiment the difunctional epoxy resin (B-1) is a compound represented by the formula:

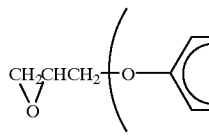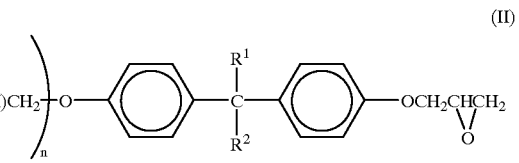

(II)

wherein in Formula (II), $R^1$ and $R^2$ are independently hydrogen or hydrocarbon groups in the range of 1 to about 20 carbon atoms, and n is a number in the range of 1 to about 20, preferably 1 to about 6, and in one embodiment 1 to about 3, and in another embodiment 1 or 2. Examples include: bisphenol A wherein $R^1$ and $R^2$ are each $CH_3$; bisphenol F wherein $R^1$ and $R^2$ are each H; bisphenol AD wherein $R^1$ is H and $R^2$ is $CH_3$. Others include resins wherein: $R^1$ is H and $R^2$ is $C_6H_{13}$; $R^1$ is H and $R^2$ is $C_{12}H_{25}$; $R^1$ is $CH_3$ and $R^2$ is $C_2H_5$; $R^1$ is $CH_3$ and $R^2$ is $C_4H_9$; etc.

The compound (B-2) is at least one compound represented by the formula:

$$R\text{-}(G)_n \tag{I}$$

In Formula (I) R is an aromatic, alicyclic or heterocyclic group. G is a functional group selected from the group consisting of COOH, OH, SH, $NH_2$, $NHR^1$, $(NHC(=NH))_m NH_2$, $R^2 COOH$, $R^2 OH$, $R^2 SH$, $R^2 NH_2$ and $R^2 NHR^1$, wherein $R^1$ is a hydrocarbon group, preferably an alkyl group, of 1 to about 6 carbon atoms, more preferably 1 to about 3 carbon atoms, and $R^2$ is an alkylene or alkylidene group, preferably an alkylene group, of 1 to about 6 carbon atoms, more preferably 1, 2 or 3 carbon atoms, and m is a number in the range of 1 to about 4 and in one embodiment m is 2. G is preferably $NH_2$, OH or $CH_2NH_2$. n is a number ranging from 3 up to the number of displaceable hydrogens on R.

The aromatic R groups in Formula (I) can be mononuclear, e.g., benzene; polynuclear wherein the aromatic nucleus is of the fused type with the aromatic nucleus being fused at two points to another nucleus, e.g., naphthalene, or of the linked type wherein at least two nuclei (mononuclear or polynuclear) are linked through bridging linkages to each other. These bridging linkages can be carbon-to-carbon single bonds, ether linkages, keto linkages, sulfide linkages, sulfur atoms, sulfinyl linkages, sulfonyl linkages, alkylene linkages, alkylidene linkages, amino linkages, etc. Normally the aromatic group R is a benzene nucleus. These aromatic groups can be alkyl-substituted aromatic groups wherein one or more alkyl groups (e.g., $C_1$–$C_{10}$) are attached to the aromatic nucleus.

The alicyclic R group in Formula (I) can be saturated or unsaturated and preferably has from 3 to 6 carbon atoms, more preferably 5 or 6 carbon atoms. These cyclic groups can be alkyl-substituted alicyclic groups wherein one or more alkyl groups (e.g., $C_1$–$C_{10}$) are attached to ring carbon atoms. Examples include R groups derived from cyclopropane, cyclobutane, cyclopentane, cyclopentene, 1,3-cyclopentadiene, cyclohexane, cyclohexene, 1,3-cyclohexadiene, etc.

The heterocyclic R group in Formula (I) is preferably derived from a 5- or 6-membered ring compound wherein the hetero atom(s) are N, S or O. These cyclic groups can be alkyl-substituted heterocyclic groups wherein one or more alkyl groups (e.g., $C_1$–$C_{10}$) are attached to ring carbon or N atoms. Examples include R groups derived from pyrrole, furan, thiophene, pyridine, etc.

Useful examples of compound (B-2) include o-aminophenol, m-aminophenol, p-aminophenol, o-phenylenediamine, m-phenylenediamine, p-phenylene diamine, 1,3-xylylenediamine, isophoronediamine, 1,3,5-trihydroxy benzene, diaminodiphenylsulfone, 1,4-xylylenediamine, 3-aminophenylsulfone, 1,4-cyclohexanediamine, 1,3-cyclohexanediamine, 1-o-tolylbiguanide, and mixtures of two or more thereof.

In one embodiment components (B-1) and (B-2) are merely blended with each other prior to or at the time of mixing with component (A). In this embodiment components (B-1) and (B-2) are not pre-reacted with each other. In one embodiment components (B-1) and (B-2) are pre-reacted with each other prior to being combined with component (A). This reaction can be effected by contacting component (B-1) with component (B-2) under reaction conditions until the desired product is obtained. In either case, the ratio of equivalents of (B-1) to (B-2) is generally from about 1:2 to about 1:4, and in one embodiment from about 1:2.5 to about 1:3.5. The weight of an equivalent of component (B-1) is determined by dividing the molecular weight of component (B-1) by the average number of epoxy groups per molecule in (B-1). The weight of an equivalent of (B-2) is determined by dividing the molecular weight of (B-2) by the number of functional groups, G, per molecule in (B-2). In determining the number of functional groups in (B-2), COOH, SH, $NHR^1$, $R^2COOH$, $R^2SH$ and $R^2NHR^1$ are each counted as one functional group. $NH_2$ and $R^2NH_2$ are each counted as two functional groups. The number of functional groups in $(NHC(=NH))_m NH_2$ is equal to the number of reactive nitrogen sites in the group. Thus, for example, when G is $NHC(=NH)NHC(=NH)NH_2$ it is counted as 6 functional groups.

When components (B-1) and (B-2) are pre-reacted with each other the reaction temperature is generally from about 60° C. to about 150° C., and in one embodiment from about 80° C. to about 110° C. The time required to complete the reaction is dependent upon the desired degree of reaction, but is generally from about 2 to about 24 hours, and in one embodiment from about 4 to about 8 hours. In one embodiment either or both of components (B-1) and (B-2) are dissolved in a suitable solvent prior to being reacted with each other. Examples of such solvents include methylisobutylketone, methyl ethyl ketone, benzene, toluene, acetone, tetrahydrofuran, etc.

In one embodiment the above-described epoxy adhesive composition also contains an effective amount of a supplemental adduct (C) to enhance the curing of the epoxy adhesive composition. This supplemental adduct is the reaction product of at least one difunctional epoxy resin with at least one alkylene polyamine. The difunctional epoxy resins are the same as the resins (B-1) discussed above. The alkylene polyamines are compounds represented by the formula:

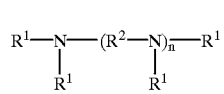 (III)

wherein in Formula (III), each $R^1$ is independently hydrogen or a hydrocarbon group, preferably alkyl, of 1 to about 10 carbon atoms, preferably 1 to about 4 carbon atoms; $R^2$ is an alkylene group of preferably 1 to about 4 carbon atoms, more preferably 2 or 3 carbon atoms; and n is a number in the range of 1 to about 10, preferably 1 to about 4, more preferably 1 or 2. Examples include ethylene diamine, triethylene tetramine, propylene diamine, trimethylene diamine, etc. The reaction between the difunctional epoxy resin and the alkylene polyamine is generally carried out at a temperature of from about 25° C. to about 100° C., and in one embodiment from about 70° C. to about 90° C. The time required to complete the reaction is dependent upon the desired degree of reaction, but is generally from about 2 to about 24 hours, and in one embodiment from about 2 to about 4 hours. In one embodiment either or both of the reactants are dissolved in a suitable solvent prior to being reacted with each other. Examples of such solvents include methylisobutylketone, methylethylketone, benzene, toluene, acetone, tetrahydrofuran, etc.

The above epoxy adhesive compositions preferably comprise from about 10% to about 40% by weight, and in one embodiment about 20% to about 30% by weight of the multifunctional epoxy (A); from about 40% to about 80% by weight, and in one embodiment about 55% to about 75% by weight of the composition (B); and up to about 25% by weight, and in one embodiment from about 5% to about 15% by weight of the supplemental adduct (C).

In one embodiment the epoxy adhesive compositions contain an effective amount of at least one low molecular weight difunctional epoxy compound to enhance the adhesive characteristics of these compositions. These low molecular weight epoxies typically have molecular weights in the range of about 160 to about 400, and in one embodiment from about 200 to about 250. In one embodiment the low molecular weight epoxy is represented by the formula:

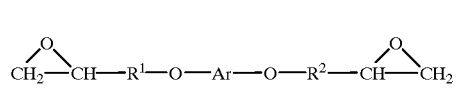 (IV)

wherein in Formula (IV), Ar is an aromatic or cycloaliphatic group of the type discussed above with respect to Formula (I) with the mononuclear groups (e.g., benzene) being preferred, and $R^1$ and $R^2$ are independently alkylene or alkylidene groups of preferably 1 to about 6 carbon atoms, and in one embodiment from 1 to about 3 carbon atoms. An example of a useful low molecular weight difunctional epoxy is one in which Ar is a benzene nucleus, and $R^1$ and $R^2$ are each methylene; this compound being available under the tradename Heloxy 69 from Rhone Poulenc. These low molecular weight difunctional epoxies are present in the adhesive compositions at concentrations of up to about 10% by weight, and in one embodiment up to about 5% by weight.

In one embodiment the epoxy adhesive composition also contains an effective amount of at least one phenolic resole to enhance the adhesive characteristics of these compositions. These resoles are typically provided in diluted form, the diluent being a suitable solvent such as ethanol, and having a solids content of, for example, about 50% to about 70% by weight. Useful phenolic resoles typically have gel times of about 30 to about 200 seconds at 150° C., and in one embodiment about 90 to about 140 seconds at 150° C. Commercially available phenolic resoles that are useful include PR-GNF-1 (a product of Sumitomo Durez identified as having a 60% by weight solids content in ethanol and a gel time of 90 to 140 seconds at 150° C.), and Arofene 536-E-56 (Ashland Chemical). The phenolic resoles are present in the adhesive compositions at concentrations of up to about 5% by weight, and in one embodiment up to about 3% by weight.

When the adhesion-promoting layer is an epoxy or phenolic resin, or mixture of epoxy resins as described above, the thickness of the layer may range from about 1 micron (10,000 Å) in thickness up to about 50 microns (500,000 Å), particularly when the coated foil is to be laminated to a paper phenolic board. The thickness of such layers often is expressed in grams/meter$^2$, and thicknesses of from about 10 to about 50 grams/meter$^2$ are useful. These thicker layers generally are applied by roll coating.

The application of the epoxy adhesives described above to the treatment layer of the metal body or foil is typically effected at a temperature of from about 15° C. to about 45° C., more often from about 20° C. to about 30° C. Following application of the epoxy adhesive to the treatment layer, the epoxy adhesive is semi-cured (B-staged) by heating it to a temperature of from about 90° C. to about 180° C., and more often from about 140° C. to about 170° C. for preferably about 0.5 to about 10 minutes to enhance drying of the surface. Generally, drying can be accomplished in from about 1 to about 5 minutes. The dry film weight of the B-staged epoxy adhesive on the treatment layer may be from about 10,000 to 500,000 Å.

The following examples are provided for purposes of illustrating the epoxy resin mixtures useful as adhesives in the adhesion-promoting layer. Unless otherwise indicated in the following example as well as throughout the specification and claims, all parts and percentages are by weight, all temperatures are in degrees centigrade, and all pressures are at or near atmospheric.

EXAMPLES 1–5

Adduct (B-I)

DER 664 (75 g, a product of Dow Chemical identified as a bisphenol A epoxy resin having an epoxy equivalent weight of about 875–975) is dissolved in 55 grams of methylisobutylketone with heating overnight to provide an epoxy solution. Meta-aminophenol (9.3 g) is dissolved in 20 grams of methylisobutylketone with heating to provide a reagent solution. The reagent solution is added to the epoxy solution and heated to 115° C. for 6 hours to provide a product that is 96% reacted based on epoxy titration.

Adduct (B-II)

DER 667 (75 g, a product of Dow Chemical identified as a bisphenol A epoxy resin having an epoxy equivalent weight of about 1600–2000) is dissolved in 75 grams of methylisobutylketone with heating overnight to provide an epoxy solution. Meta-aminophenol (4.5 g) is dissolved in 15 grams of methylisobutylketone with heating to provide a reagent solution. The reagent solution is added to the epoxy solution and heated to 115° C. for 10.5 hours to provide a product that is 90% reacted based on epoxy titration.

Adducts (B-I) and (B-II) are blended with various multifunctional epoxies as indicated in Table I below to provide the adhesive formulations indicated in the table. The multifunctional epoxies that are used are:

MT 0163 (a product of Ciba Geigy identified as a tetrafunctional epoxy resin);

Tactix 785 (a product of Dow Chemical identified as an epoxy novolac); and

DPS 164 (a product of Shell identified as an epoxy novolac).

TABLE I

| Example | Formulation |
|---------|-------------|
| 1 | 75% Adduct (B-I) |
|   | 25% MT 0163 |
| 2 | 75% Adduct (B-I) |
|   | 25% Tactix 785 |
| 3 | 20% Adduct (B-I) |
|   | 55% Adduct (B-II) |
|   | 25% Tactix 785 |
| 4 | 25% Adduct (B-I) |
|   | 50% Adduct (B-II) |
|   | 25% Tactix 785 |
| 5 | 75% Adduct (B-I) |
|   | 25% DPS 164 |

Other organic materials which are also useful in the adhesion-promoting layer include: benzotriazole and its derivatives; metal salts of organic acids such as sodium and potassium citrates; organic amines; cydric alklene ureas; orthoesters; etc. Inorganic adhesion-promoting layers may comprise phosphorus or chromium-containing compounds.

In another embodiment the adhesion-promoting layers used in the present invention may comprise various organometallic compounds such as those based on silicon, titanium, zirconium, aluminum, etc.

A variety of titanates useful as adhesion-promoters are available commercially such as from Kenrich Petrochemicals, Inc. under the trade designation Ken-React®. The types of titanates include: monoalkoxy titanates such as isopropyl tri(N-ethylaminoethylamino) titanate, isopropyl tri-isostearoyl titanate and titanium di(dioctylpyrophosphate) oxyacetate; coordinate titanates such as tetraisopropyl di(dioctylphosphito)titanate; and neoalkoxy titanates such as neoalkoxy tri(p-N-(β-aminoethyl)aminophenyl)titanate. Other types include chelate, quaternary and cycloheteroatom titanates.

Zirconium adhesion promoters are also available from Kenrich. Typical zirconates include neoalkoxy trisneodecanoyl zirconate, neoalkoxy tris(dodecanoyl) benzenes sulfonyl zirconate, neoalkoxy tris(m-aminophenyl) zirconate, ammonium zirconium carbonate and zirconium propionate.

In one preferred embodiment, the adhesion-promoting layer comprises at least one organofunctional silane. Any of the silane compounds conventionally used in preparing PCBs can be used in the present invention. In one embodiment, the organofunctional silane may be a silane coupling agent represented by the formula:

$$R_{4-n}SiX_n \tag{V}$$

wherein R is an alkyl or aryl group, or a functional group represented by the formula:

$$C_xH_{2x}Y$$

wherein x is from 0 to 20 and Y is selected from the group consisting of amino, amido, hydroxy, alkoxy, halo, mercapto, carboxy, acyl, vinyl, allyl, styryl, epoxy, isocyanato, glycidoxy and acryloxy groups, X is a hydrolyzable group, such as alkoxy (e.g., methoxy, ethoxy, etc.), phenoxy, acetoxy, etc., or halogen (e.g., chlorine); and n is 1, 2, 3 or 4, and preferably n is 3. The silane coupling agents represented by Formula (V) include halosilanes, aminoalkoxysilanes, aminophenylsilanes, phenylsilanes, heterocyclic silanes, N-heterocyclic silanes, acrylic silanes and mercapto silanes. Mixtures of two or more silanes also are useful. In one embodiment X is OR wherein R is an alkyl group containing up to about 5 carbon atoms or an aryl group containing up to about 8 carbon atoms. In other embodiments x is an integer from 0 to 10 and more often from 1 to about 5.

Examples of silanes wherein R is an alkyl or aryl group include methyltrimethoxysilane, ethylltrimethoxysilane, phenyltrimethoxysilane, phenyltriacetoxy silane, methyltrimethoxysilane, etc.

Examples of vinyl-containing silanes include vinyltrimethoxysilane, 1,3-divinyltetramethyldisilane vinyltriethoxysilane, vinyltriisopropoxysilane, vinyl tris(2-methoxyethoxy) silane and vinyltris (t-butylperoxy) silane.

The silane coupling agent can be an epoxy silane represented by the formula:

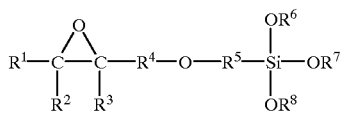

(VI)

wherein: $R^1$, $R^2$ and $R^3$ are independently hydrogen or hydrocarbon groups; $R^4$ and $R^5$ are independently alkylene or alkylidene groups; and $R^6$, $R^7$ and $R^8$ are independently hydrocarbon groups. The hydrocarbon groups preferably contain 1 to about 10 carbon atoms, more preferably 1 to about 6 carbon atoms, more preferably 1 to about 4 carbon atoms. These hydrocarbon groups are preferably alkyl. The alkylene or alkylidene groups $R^4$ and $R^5$ preferably contain from 1 to about 10 carbon atoms, more preferably 1 to about 6 carbon atoms, more preferably 1 to about 4 carbon atoms, more preferably 1 or 2 carbon atoms. The alkylene and alkylidene groups can be methylene, ethylene, propylene, etc. One example of such a compound is represented by the formula:

(VIA)

In another embodiment, the silane coupling agent can be an acrylic silane represented by the formula:

(VII)

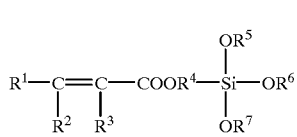

wherein: $R^1$, $R^2$ and $R^3$ are independently hydrogen or hydrocarbon groups; $R^4$ is an alkylene or alkylidene group; and $R^5$, $R^6$ and $R^7$ are independently hydrocarbon groups. The hydrocarbon groups preferably contain 1 to about 10 carbon atoms, more preferably 1 to about 6 carbon atoms, more preferably 1 to about 4 carbon atoms. These hydrocarbon groups are preferably alkyl (e.g., methyl, ethyl, propyl, etc.). The alkylene and alkylidene groups preferably contain from 1 to about 10 carbon atoms, more preferably 1 to about 6 carbon atoms, more preferably 1 to about 4 carbon atoms. The alkylene groups include methylene, ethylene, propylene, etc. An example of such compound is represented by the formula:

$$CH_2=C(CH_3)COOCH_2CH_2CH_2Si(OCH_3)_3 \quad (VIIA)$$

The silane coupling agent also can be an amino silane represented by the formula:

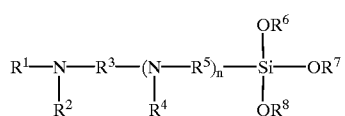
(VIII)

wherein: $R^1$, $R^2$ and $R^4$ are independently hydrogen or hydrocarbon groups; $R^3$ and $R^5$ are independently alkylene or alkylidene groups; $R^6$, $R^7$ and $R^8$ are independently hydrocarbon groups; and n is 0 or 1. The hydrocarbon groups preferably contain 1 to about 10 carbon atoms, more preferably 1 to about 6 carbon atoms, more preferably 1 to about 4 carbon atoms. These hydrocarbon groups are preferably alkyl (e.g., methyl, ethyl, propyl, etc.). The alkylene and alkylidene groups preferably contain from 1 to about 10 carbon atoms, more preferably 1 to about 6 carbon atoms, more preferably 1 to about 4 carbon atoms. The alkylene groups include methylene, ethylene, propylene, etc. Examples of such silanes include those represented by the formulae:

$$H_2NCH_2CH_2CH_2Si(OC_2H_5) \quad (VIIIA)$$

$$H_2NCH_2CH_2NHCH_2CH_2CH_2Si(OCH_3)_3 \quad (VIIIB)$$

The mercapto silane coupling agents can be represented by the formula:

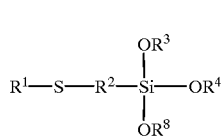
(IX)

wherein $R^1$ is hydrogen or a hydrocarbon group; $R^2$ is an alkylene or alkylidene group; and $R^3$, $R^4$ and $R^5$ are independently hydrocarbon groups. The hydrocarbon groups preferably contain 1 to about 10 carbon atoms, more preferably 1 to about 6 carbon atoms, more preferably 1 to about 4 carbon atoms. These hydrocarbon groups are preferably alkyl (e.g., methyl, ethyl, propyl, etc.). The alkylene and alkylidene groups preferably contain from 1 to about 10 carbon atoms, more preferably 1 to about 6 carbon atoms, more preferably 1 to about 4 carbon atoms. These groups are preferably alkylene (e.g., methylene, ethylene, propylene, etc.). One example of such a compound is:

$$HSCH_2CH_2CH_2Si(OCH_3)_3 \quad (IXA)$$

In yet another embodiment, the silane coupling agent can be represented by the formula:

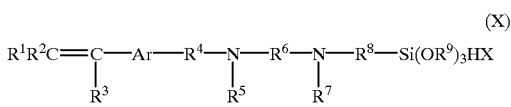
(X)

wherein: $R^1$, $R^2$, $R^3$, $R^5$ and $R^7$ are independently hydrogen or hydrocarbon groups; $R^4$, $R^6$ and $R^8$ are independently alkylene or alkylidene groups; each $R^9$ is independently a hydrocarbon group; Ar is an aromatic group; and X is a halogen. The hydrocarbon groups preferably contain 1 to about 10 carbon atoms, more preferably 1 to about 6 carbon atoms, more preferably 1 to about 4 carbon atoms. These hydrocarbon groups are preferably alkyl (e.g., methyl, ethyl, propyl, etc.). The alkylene and alkylidene groups preferably contain from 1 to about 10 carbon atoms, more preferably 1 to about 6 carbon atoms, more preferably 1 to about 4 carbon atoms. These groups are preferably alkylene (e.g., methylene, ethylene, propylene, etc.). The aromatic group Ar can be mononuclear (e.g., phenylene) or polynuclear (e.g., naphthylene) with the mononuclear groups and especially phenylene being preferred. The halogen, X, is preferably chlorine or bromine, more preferably chlorine. An example of such a silane is represented by the formula:

$$CH_2=CHC_6H_4CH_2NHCH_2CH_2NH(CH_2)_3Si(OCH_3)_3HCl \quad (XA)$$

In yet another embodiment, the silane coupling agent can be represented by the formula:

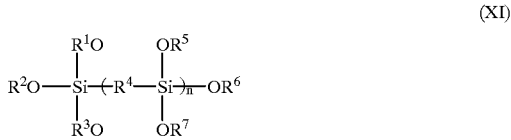
(XI)

wherein $R^1$, $R^2$, $R^3$, $R^5$, $R^6$ and $R^7$ are independently hydrocarbon groups; $R^4$ is an alkylene or alkylidene group; and n is 0 or 1. The hydrocarbon groups preferably contain 1 to about 10 carbon atoms, more preferably 1 to about 6 carbon atoms, more preferably 1 to about 4 carbon atoms. These hydrocarbon groups are preferably alkyl (e.g., methyl, ethyl, propyl, etc.). The allkylene and alkylidene group preferably contains from 1 to about 10 carbon atoms, more preferably 1 to about 6 carbon atoms, more preferably 1 to about 4 carbon atoms. This group is preferably alkylene (e.g., methylene, ethylene, propylene, etc.). Examples of such compounds include tetraethoxy silane and $(CH_3O)_3SiCH_2CH_2Si(OCH_3)_3$.

In one preferred embodiment, the silane coupling agents include those selected from the group consisting of aminopropyltrimethoxy silane, tetraethoxy silane, bis(2-hydroxyethyl)-3-aminopropyltriethoxy silane, 3-(N-styrylmethyl-2-aminoethylamine) propyltrimethoxy silane, 3-glycidoxypropyltrimethoxy silane, N-methylaminopropyltrimethoxy silane, 2-(2-aminoethyl-3-aminopropyl)trimethoxy silane, and N-phenylaminopropyltrimethoxy silane, and mixtures thereof.

A useful silane coupling agent mixture is 3-glycidoxypropyltrimethoxy silane and phenyltriethoxy silane. The weight ratio of the former to the latter preferably ranges from about 1:10 to about 10:1, more preferably about 1:5 to about 5:1, and in one embodiment the weight ratio is about 1:3.

Another useful silane mixture is 3-glycidoxypropyltrimethoxy silane and tetraethoxy silane in a weight ratio of from about 1:5 to about 5:1. In one preferred embodiment the weight ratio is about 1:1.

Another useful silane coupling agent mixture is N-methylaminopropyltrimethoxy silane and chloropropyltrimethoxy silane. The weight ratio of the former to the latter preferably ranges from about 1:10 to about 10:1, more preferably about 1:5 to about 5:1, and in one embodiment the weight ratio is about 1:1.

Another useful silane coupling agent mixture is 3-(N-styrylmethyl-2-aminoethyl amino)propyltrimethoxy silane and N-methylaminopropyltrimethoxy silane. The weight ratio of the former to the latter preferably ranges from about 1:10 to about 10:1, more preferably about 1:5 to about 5:1, and in one embodiment the weight ratio is about 1:1.

Yet another useful silane coupling agent mixture is 3-glycidoxypropyltrimethoxy silane and N-methylaminopropyltrimethoxy silane. The weight ratio of the former to the latter preferably ranges from about 1:10 to about 10:1, more preferably about 1:5 to about 5:1, and in one embodiment the weight ratio is about 1:3.

The adhesion-promoting layers present on the metal bodies and foils of the present invention may be applied to the bodies and foils after the vapor-deposited treatment layer using known application methods which include reverse roller coating, doctorblade coating, dipping, painting, spraying, brushing, electrode-position, vapor deposition, etc. The adhesion-promoting material which can be applied by any of these procedures may be neat or dispersed or dissolved in a suitable medium. The process of applying the adhesion-promoting materials may be repeated, if desired, several times.

The organofunctional silane compounds generally are applied in a suitable medium to the vapor-deposited treatment surface. More specifically, the silane coupling agents can be applied to the treatment layer in the form of a solution in water, a mixture of water and alcohol, or a suitable organic solvent, or as an aqueous emulsion of the silane coupling agent, or as an aqueous emulsion of a solution of the silane coupling agent in a suitable organic solvent. Conventional organic solvents may be used for the silane coupling agent and include, for example, alcohols, ethers, ketones, and mixtures of these with aliphatic or aromatic hydrocarbons or with amides such as N,N-dimethylformamide. Useful solvents are those having good wetting and drying properties and include, for example, water, ethanol, isopropanol, and methylethylketone. Aqueous emulsions of the silane coupling agent may be formed in conventional manner using conventional dispersants and surfactants, including non-ionic dispersants. It may be convenient to contact the metal surface with an aqueous emulsion of the silane coupling agent. The concentration of the silane coupling agent in such solutions or emulsions can be up to about 100% by weight of the silane coupling agent, but preferably is in the range of about 0.1% to about 5% by weight, more preferably about 0.3% to about 1% by weight. The process of coating with the silane coupling agent may be repeated, if desired, several times. However, a single coating step gives generally useful results.

The application of the silane coupling agent to the treatment layer is typically effected at a temperature of about 15° C. to about 45° C., more preferably about 20° C. to about 30° C. Following application of the silane coupling agent, it can be heated to a temperature of about 60° C. to about 170° C., preferably about 90° C. to 150° C., for about 0.1 to about 5 minutes, more often from about 0.2 to about 2 minutes to enhance drying of the surface. The dry film thickness of the silane coupling agent layer is generally from about 4 to about 200 Å, more often about 5 to 40 Å.

Embodiments of the inventive metal foils containing at least one vapor-deposited treatment layer and at least one adhesion-promoting layer over the treatment layer are illustrated in FIGS. 1–4. FIG. 1 illustrates a metal foil 10 of the present invention which comprises metal foil 11, a vapor-deposited layer 12 overlaying the metal foil, and an adhesion-promoting layer 13 overlaying the vapor-deposited layer 12.

Figure 2:
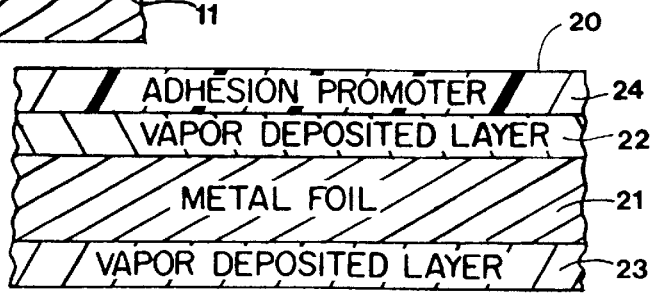
FIG. 2 is a schematic diagram representing a cross-sectional view of another metal foil of the present invention.

FIG. 2 illustrates another embodiment of the metal foil 20 of the invention which comprises the metal foil 21, a vapor-deposited layer 22 overlaying one side of the metal foil 21, an adhesion-promoting layer 24 overlying the vapor-deposited layer 22, and a second vapor-deposited layer 23 on the other side of the metal foil 21. When the metal foil 21 in FIG. 2 is an electrodeposited metal foil having a shiny side and a matted side, the vapor-deposited layer 22 generally will overlay the matte side of the metal foil, and the vapor-deposited layer 23 will overlay the shiny side.

Figure 3:
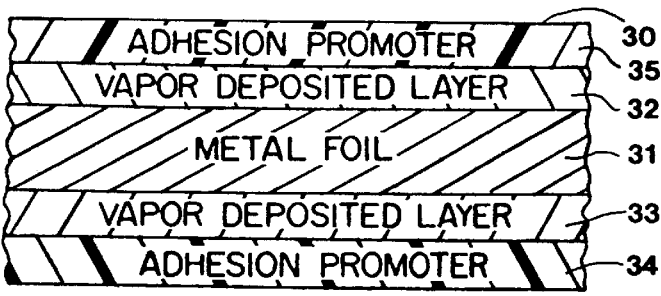
FIG. 3 is a schematic diagram representing a cross-sectional view of another metal foil according to the present invention.

FIG. 3 illustrates yet another embodiment of the metal foil 30 of the invention wherein the foil has a vapor-deposited layer and an adhesion-promoting layer on both sides of the foil. In particular, foil 31 is coated on one side with vapor-deposited layer 32 and on the other side with vapor-deposited layer 33. Adhesion-promoting layers 34 and 35 overlay and adhere to the vapor-deposited layers 33 and 32, respectively.

Figure 4:
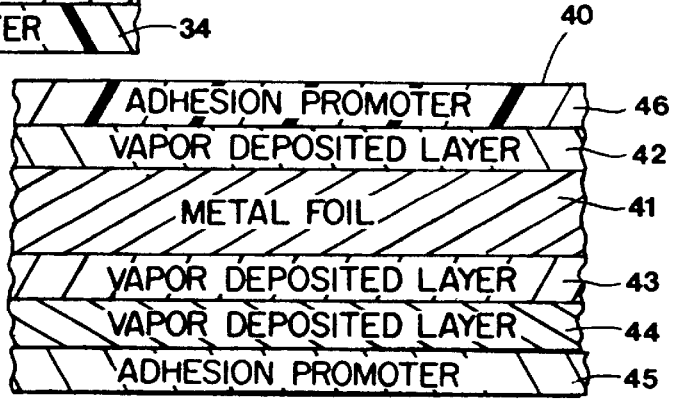
FIG. 4 is a schematic diagram representing a cross-sectional view of another metal foil according to the present invention.

FIG. 4 illustrates another metal foil 40 of the invention wherein two vapor-deposited treatment layers are applied to one side of the metal foil. In particular, the metal foil 41 is coated on one side with vapor-deposited layer 43, and then a second vapor-deposited layer 44 is applied over and adheres to vapor-deposited layer 43. A third layer of vapor-deposited material 42 is applied to the other side of the foil 41. Finally, adhesion-promoting layers 45 and 46 overlay and adhere to the vapor-deposited treatment layers 44 and 42, respectively.

Another embodiment of the invention (not shown in the Figures) comprises a copper foil having an electrodeposited-metal coating on both sides of the foil, a vapor-deposited metal coating on the electrodeposited metal coating on the matte side, and an adhesion-promoting silane layer overlying and adhered to the vapor-deposited layer.

The following examples illustrate methods of preparing the metal foils of the invention.

EXAMPLES A–I

A 1-ounce/ft$^2$ standard profile electrodeposited copper foil is cleaned and microetched by dipping in an aqueous acidic solution containing 20% sulfuric and 1% hydrogen peroxide at 65° C. for about 10 seconds. The foil is then rinsed with deionized water and dried. Chips or a foil of the metal to be deposited are placed on a tungsten or molybdenum boat in the Edwards apparatus described above, and the cleaned and microetched copper foil is placed about 5 inches above the evaporation source inside a Bell jar, and the vacuum is reduced to about $10^{-4}$ millibar or lower before evaporation proceeds. The metal is evaporated at a fixed current for between about 0.5 to about 40 minutes. After the vapor deposition process is completed, the sample is taken out of the apparatus for evaluation.

An aqueous solution containing 0.25% w of 3-glycidoxypropyltrimethoxysilane and 0.25% w of tetra-ethoxysilane is prepared, and the foil having the vapor-deposited layer is coated on both sides by dipping in the solution for 30 seconds. After removing excess solution, the silane-coated foil is then oven-cured for about 1 minute at about 90° C. In some of the examples, the microetched foil is dipped in an aqueous acidic solution containing chromium oxide ($CrO_3$) to provide a chromium coating either prior to vapor depositing the metal on the foil or subsequent to vapor depositing the metal on the foil. The details of Examples A–I are summarized in the following Table I.

TABLE I

| | Standard Profile Raw Foil Matte Side | | | |
|---|---|---|---|---|
| | | | Vapor Deposited Layer | |
| Example | Chromium Dip | Metal | Current (mA) | Time (min) |
| A | No | Al | 50–65 | 4–6 |
| B | No | Zn | 35–50 | 4–10 |
| C | No | Mn | 50–65 | 4–6 |
| D | No | In | 50–65 | 6–20 |
| E | Yes* | In | 50–65 | 6–20 |
| F | No | Sn | 50–65 | 6–20 |
| G | No | Ag | 35–50 | 6–15 |
| H | No | Co | 65–80 | 0.5–4 |
| I | No | Ni | 65–80 | 0.5–4 |

*Chrome dip after vapor deposition.

EXAMPLES J–S

The general procedure of Examples A–J is repeated except that the raw foil is a controlled low profile electrodeposited copper foil (1 ounce/ft$^2$) having a substantially uniform randomly oriented grain structure that is essentially columnar grain-free and twin-boundary free and has an average grain size of up to about 10 microns. In addition, as indicated in the following Table II, the vapor-deposited layer is coated with either 3-glycidoxypropyltrimethoxysilane (Silane-1) or a mixture in water of 0.25% by weight of 3-glycidyloxypropyltrimethoxysilane and 0.25% by weight of tetraethoxysilane (Mixture-1). The metal is deposited on the matte side of the foil. The details of Examples J–S are summarized in the following Table II.

TABLE II

| | Controlled Low Profile Foil Matte Side | | | |
|---|---|---|---|---|
| | | Vapor Deposited Layer | | |
| Example | Metal | Current (mA) | Time (min) | Silane Treatment |
| J | Mg | 35–50 | 10–30 | Silane-1 |
| K | Mg | 35–50 | 10–30 | Mixture-1 |
| L | Ti | 65–80 | 4–6 | Silane-1 |
| M | Ti | 65–80 | 4–6 | Mixture-1 |
| N | Cr | 65–80 | 4–6 | Silane-1 |
| O | Cr | 65–80 | 4–6 | Mixture |
| P | Mn | 50–65 | 4–6 | Silane-1 |
| Q | Mn | 50–65 | 4–6 | Mixture-1 |
| R | In | 50–65 | 6–20 | Silane-1 |
| S | In | 50–65 | 6–20 | Mixture-1 |

EXAMPLES T–W

The procedure utilized in these examples is similar to the procedure of Examples J–S with the exception that the metal is vapor-deposited on the shiny side of the copper foil. Details of Examples T–W are summarized in the following Table III.

TABLE III

| | Controlled Low Profile Foil Shiny Side | | | |
|---|---|---|---|---|
| | | Vapor Deposited Layer | | |
| Example | Metal | Current (mA) | Time (min) | Silane Treatment |
| T | Al | 50–65 | 2–6 | Mixture-1 |
| U | Mg | 35–50 | 2–6 | Mixture-1 |
| V | Zn | 35–50 | 2–6 | Mixture-1 |
| W | In | 50–65 | 2–6 | Mixture-1 |

The metal foils of the present invention having at least one vapor-deposited treatment layer overlying and adhered to at least one side of the foil, and a layer of adhesion-promoting material overlying and adhering to at least one treatment layer are particularly useful for forming laminates by bonding the treated copper foils to dielectric substrates. Such laminates provide dimensional and structural stability to the treated copper foils. The combination of the vapor deposited treatment layer and the adhesion-promoting layer on the foil enhances the bond and peel strength between the copper foil and the dielectric substrate. One advantage of the metallic foils of the present invention having the vapor-deposited treatment layer and the adhesion-promoting layer is that satisfactory bond and peel strength can be obtained without having to provide added surface roughening of the foil prior to application of the vapor-deposited treatment layer. Even though the metallic foils may have a standard profile surface, a low-profile surface or even a very low-profile surface, desirable peel strengths are obtained as a result of the presence of the vapor-deposited treatment layer and adhesion-promoting layer. With the foils of the invention, either the matte side or the shiny side can be effectively bonded to a dielectric substrate.

Useful dielectric substrates may be prepared by impregnating woven glass reinforcement materials with partially cured resins, usually epoxy resins (e.g., difunctional, tetrafunctional and multifunctional epoxies). Other useful resins include amino type resins produced from the reaction of formaldehyde and urea or formaldehyde and melamine, polyesters, phenolics, silicones, polyamides, polyimides, di-allyl phthlates, phenylsilanes, polybenzimidazoles, diphenyloxides, polytetrafluoro-ethylenes, cyanate esters, and the like. These dielectric substrates are sometimes referred to as prepregs.

In preparing the laminates, it is useful for both the prepreg material and the copper foil to be provided in the form of long webs of material rolled up in rolls. In one embodiment these long webs of foil and prepreg are laminated using a continuous process. In this process a continuous web of the inventive foil with the vapor-deposited treatment layer(s) and adhesion-promoting layer(s) adhered thereto is brought into contact with a continuous web of prepreg material with the adhesive layer of the foil contacting the prepreg material under laminating conditions to form a laminate structure. This laminate structure is then cut into rectangular sheets and the rectangular sheets are then laid-up or assembled in stacks of assemblages.

In one embodiment the long webs of foil and prepreg material are first cut into rectangular sheets and then subjected to lamination. In this process rectangular sheets of the inventive foil and rectangular sheets of the prepreg material are then laid-up or assembled in stacks of assemblages.

Each assemblage may comprise a prepreg sheet with a sheet of foil on either side thereof, and in each instance, the side (or one of the sides) of the copper foil sheet with the adhesion-promoting layer adhered thereto is positioned adjacent the prepreg. The assemblage may be subjected to conventional laminating temperatures and pressures between the plates of laminating presses to prepare laminates comprising sandwiches of a sheet of prepreg between sheets of copper foil.

The prepregs may consist of a woven glass reinforcement fabric impregnated with a partially cured two-stage resin. By application of heat and pressure, the copper foil is pressed tightly against the prepreg and the temperature to which the assemblage is subjected activates the resin to cause curing, that is crosslinking of the resin and thus tight bonding of the foil to the prepreg dielectric substrate. Generally speaking, the laminating operation will involve pressures in the range of from about 200 to about 750 psi, more often 200 to 500 psi, temperatures in the range of from about 70° C. to 400° C., more often about 70° C. to about 200° C., and a laminating cycle of from about a few minutes to about 2 hours. The finished laminate may then be utilized to prepare printed circuit boards (PCB).

In one embodiment, the laminate is subjected to a subtractive copper etching process to form electrically conductive lines or an electrically conductive pattern as part of a process for making a multilayered circuit board. A second adhesion-promoting layer is then applied over the etched pattern using the techniques discussed above and then a second prepreg is adhered to the etched pattern; the second adhesion-promoting layer being positioned between and adhered to both the etched pattern and the second prepreg. The techniques for making multilayered circuit boards are well known in the art. Similarly, subtractive etching processes are well known, an example of which is disclosed in U.S. Pat. No. 5,017,271, which is incorporated herein by reference.

Figure 5:
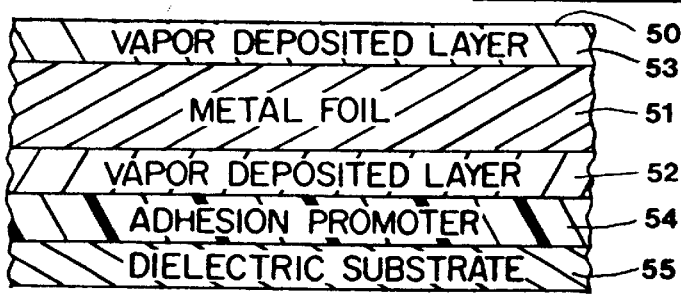
FIG. 5 is a schematic diagram representing a cross-sectional view of another metal foil according to the present invention.
Figure 6:
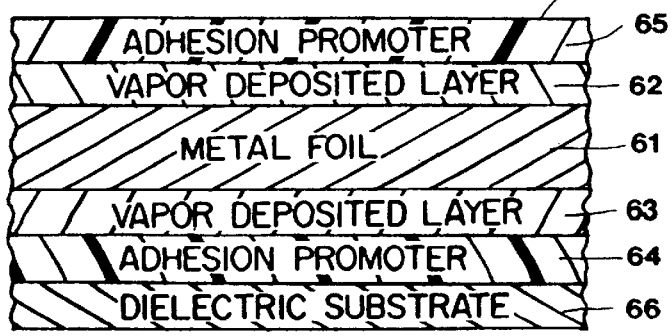
FIG. 6 is a schematic diagram representing a cross-sectional view of another metal foil according to the present invention.

Laminates obtained by bonding the metal foils of the present invention to a dielectric substrate are illustrated in FIGS. 5 and 6. The laminate 50 of FIG. 5 comprises a metal foil 51 having a vapor-deposited treatment layer 52 overlaying and adhered to one side of the metal foil 51 and a second vapor-deposited treatment layer 53 overlaying and adhering to the other side of the metal foil 51. An adhesion-promoting layer 54 overlays and is adhered to the vapor-deposited treatment layer 52 and a dielectric substrate 55 is bonded to the treatment layer 52.

The structure illustrated in FIG. 6 is identical to the structure illustrated in FIG. 4 with the exception that the foil 60 of FIG. 6 contains an additional adhesion-promoting layer 65. Thus, FIG. 6 illustrates a metal foil 60 of the invention which comprises a metallic foil 61 having a vapor-deposited treatment layer 63 on one side and a vapor-deposited treatment layer 62 on the other side of the metallic foil 61. Adhesion-promoting layers 64 and 65 overlay and adhere to the vapor-deposited treatment layers 63 and 62, respectively. A dielectric substrate 66 overlays and is bonded to the adhesion-promoting layer 64.

A number of manufacturing methods are available for preparing PCBs from laminates. Additionally, there is a myriad of possible end use applications including radios, televisions, computers, etc., for the PCB's. These methods and end uses are known in the art.

An advantage of the present invention is that the vapor-deposited treatment layer(s) and the adhesion-promoting layer(s) not only enhance adhesion, they also provides enhanced oxidation resistance characteristics to the treated foil particularly when a vapor-deposited layer overlays the shiny side of an electrodeposited copper foil. This latter characteristic is of particular value due to the fact that the trend in the industry is for faster and hotter processing practices. Another advantage is that the vapor-deposited treatment layer and the adhesion-promoting layer provide enhanced acid undercutting resistance to the treated foils.

The improved adhesion exhibited between the copper foils of the present invention and the polymeric substrates such as multifunctional epoxy prepregs and difunctional epoxy prepregs is demonstrated by laminating some of the treated copper foils of Examples described above to a prepreg, and thereafter evaluating the laminate for initial peel strength in pounds/inch using the standard Peel Strength Test of IPC TM-650. For comparison, each of the unreacted (raw) foils also is laminated to the prepregs and evaluated. The results of some of these tests are summarized in the following Table IV.

In Table IV, the examples indicated as control examples correspond to the referred-to example except that the silane adhesion-promoting layer was not applied over the vapor-deposited layer prior to lamination. For example, the Control-A example is a laminate comprising the foil layer, a vapor-deposited aluminum layer and the indicated prepreg bonded to the aluminum layer. The Example A laminate comprises the copper foil, an aluminum layer, a silane layer over the aluminum layer and the prepreg over the silane layer.

TABLE IV

Peel Strength Test Results
Initial Peel Strength (lb/in)

| Foil of Example | Multifunctional Epoxy Prepreg | Difunctional Epoxy Prepreg |
|---|---|---|
| A | 1 | 11.6 |
| Control A | NA[1] | 11.7 |
| B | 10.1 | 11.1 |
| Control B | 5.3 | 5.8 |
| C | 10.8 | NA |
| Control C | 4.6 | NA |
| D | 10.5 | 10.8 |
| Control D | 7.3 | 6.2 |
| E | 10.8 | 11.8 |
| Control E | 8.4 | 9.6 |
| F | 9.4 | NA |
| Control F | 7.8 | NA |
| H | 11.0 | NA |
| Control H | 4.4 | NA |
| J | 1.7 | NA |
| Control J | 0.4 | NA |
| K | 5.2 | NA |
| Control K | 0.4 | NA |
| L | 6.4 | NA |
| Control L | 2.6 | NA |
| M | 5.8 | NA |
| Control M | 2.6 | NA |
| T | 5.4 | 7.1 |
| Control T | 5.0 | 7.3 |
| V | 4.8 | 7.0 |
| Control V | 1.2 | 4.7 |
| W | 5.4 | 5.3 |
| Control W | 1.8 | 2.7 |
| Untreated Foil Comparisons | | |
| Standard Foil[2] (matte side) | 2.8 | 5.9 |

TABLE IV-continued

| | Peel Strength Test Results Initial Peel Strength (lb/in) | |
|---|---|---|
| Foil of Example | Multifunctional Epoxy Prepreg | Difunctional Epoxy Prepreg |
| Low Profile Foil[3] (matte side) | 0.4 | NA |
| Low Profile Foil[4] (shiny side) | 0.2 | 1.9 |

[1]NA = not available.
[2]As used in Examples A–I.
[3]As used in Examples J–S.
[4]As used in Examples T–W.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A process for treating a copper foil to enhance adhesion to laminating materials, comprising:
   vapor depositing at least one metallic treatment layer on at least one side of an untreated copper foil; and
   applying at least one layer of at least one adhesion-promoting material over and adhered to said treatment layer, said adhesion-promoting material being suitable for enhancing adhesion between said foil and laminating materials;
   wherein the metal in the vapor-deposited metallic treatment layer is selected from the group consisting of magnesium, aluminum, titanium, chromium, manganese, copper, bismuth, cobalt, nickel, zinc, indium, tin, molybdenum, silver, gold, tungsten, zirconium, antimony, chromium-zinc alloys, brass, bronze, and mixtures or alloys thereof,
   wherein said adhesion promoting material is at least one selected from multifunctional epoxy resins and organofunctional silanes.

2. The process of claim 1 wherein the foil is an electrodeposited copper foil.

3. The process of claim 2 wherein the copper foil is a controlled low profile electrodeposited copper foil having a substantially uniform randomly oriented grain structure that is essentially columnar grain free and twin boundary free and has an average grain size of up to about 10 microns.

4. The process of claim 2 wherein the copper foil is a standard profile electrodeposited copper foil having a columnar grain structure of preferred orientation and crystal defects including discolorations and twin boundaries and having an average grain size of up to about 20 microns.

5. The process of claim 1 wherein the foil is a wrought copper foil.

6. The process of claim 1 wherein the foil is an as-plated or annealed electrodeposited copper foil.

7. The process of claim 1 wherein the foil is an as-rolled or annealed wrought copper foil.

8. The process of claim 1 wherein said treatment layer is vapor-deposited on both sides of the foil.

9. The process of claim 1 wherein said treatment layer is vapor-deposited on both sides of the foil and said adhesion-promoting material is deposited on the treatment layer on both sides of the foil.

10. The process of claim 1 wherein the foil is an electrodeposited copper foil having a shiny side and a matte side, and said treatment layer is vapor-deposited on the matte side of the copper foil.

11. The process of claim 10 wherein the metal of the treatment layer on the matte side is selected from the group consisting of indium, tin, cobalt, nickel, copper, manganese, chromium titanium, bismuth, zinc, and zinc-chromium alloys, and mixtures of two or more of said metals.

12. The process of claim 10 wherein a metallic treatment layer is vapor-deposited on the shiny side of the copper foil, and the metal of said metallic treatment layer on the shiny side is selected from the group consisting of indium, magnesium, aluminum, copper, zinc, chromium, tin, nickel, cobalt and zinc-chromium alloys, and mixtures of two or more of said metals.

13. The process of claim 1 wherein the adhesion-promoting material is applied by vapor deposition.

14. The process of claim 1, wherein the metallic treatment layer is deposited by sputtering.

15. The process of claim 1 wherein the adhesion-promoting material is a multifunctional epoxy compound selected from the group consisting of trifunctional epoxies, tetrafunctional epoxies and epoxy novolacs, and mixtures thereof.

16. The process of claim 1 wherein the adhesion-promoting material comprises a mixture of epoxy resins comprising (A) at least one multifunctional epoxy resin; and (B) a composition derived from (B-1) at least one difunctional epoxy resin; and (B-2) at least one component represented by the formula:

$$R\text{--}(G)_n \qquad (I)$$

wherein in Formula I, R is an aromatic, alicyclic or heterocyclic group; G is a functional group selected from the group consisting of COOH, OH, SH, $NH_2NHR^1$, $(NHC(=\!\!=\!\!NH))_mNH_2$, $R^2COOH$, $R^2OH$, $R^2SH$, $R^2NH_2$ and $R^2NHR^1$, wherein $R^1$ as a hydrocarbon, $R^2$ is an alkylene or alkylidene group, and m is a number in the range of from 1 to about 4; and n is a number ranging from 3 up to the number of displaceable hydrogens on R.

17. The process of claim 1 wherein the adhesion-promoting material is at least one organofunctional silane compound represented by the formula:

$$R_{4-n}SiX_n$$

wherein R is an alkyl or aryl group or a functional group represented by the formula $C_xH_{2x}Y$ wherein x is from 0 to 20 and Y is selected from the group consisting of amino, amido, hydroxy, alkoxy, halo, mercapto, carboxy, aryl, vinyl, allyl, styryl, epoxy, isocyanate, glycidoxy, and acryloxy groups, X is a hydrolyzable group; and n is 1, 2, 3 or 4.

18. The process of claim 1 wherein the thickness of said vapor deposited treatment layer is from about 10 Å to about 3000 Å.

19. The process of claim 1 wherein the adhesion-promoting material is at least one epoxy silane represented by the formula:

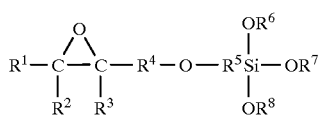

wherein $R^1$, $R^2$ and $R^3$ are independently hydrogen or hydrocarbon groups; $R^4$ and $R^5$ are independently alkylene or alkylidene groups; and $R^6$, $R^7$ and $R^8$ are independently hydrocarbon groups.

20. The process of claim 1 wherein said treatment layer is subjected to an elevated temperature of from about 80° C. to about 800° C. prior to application of the adhesion-promoting material.

21. The process of claim 1 wherein two treatment layers are vapor-deposited on at least one side of the foil, each treatment layer comprising a different metal.

* * * * *